June 13, 1967 J. A. CUNNINGHAM 3,325,702

HIGH TEMPERATURE ELECTRICAL CONTACTS FOR SILICON DEVICES

Filed April 21, 1964

James A. Cunningham
INVENTOR

BY

ATTORNEY 3,325,702
Patented June 13, 1967

3,325,702

HIGH TEMPERATURE ELECTRICAL CONTACTS FOR SILICON DEVICES

James A. Cunningham, Dallas, Tex., assignor to Texas Instruments Incorporated, Dallas, Tex., a corporation of Delaware Filed Apr. 21, 1964, Ser. No. 361,406
7 Claims. (Cl. 317—234)

This invention relates to semiconductor devices. More particularly the invention relates to contacts therefor and to a method of making the same.

In many classes of semiconductor devices, it is important to provide an electrode connection to the semiconductor wafer or body which is permanent, mechanically sturdy, and of low resistance. Permanence and sturdiness of the connection are important for long life. Low resistance is important to minimize resistance losses which limit the current handling capabilities of the device.

Aluminum, among other metals, provides suitable contacts to silicon as long as the temperature of the device does not exceed about 650° C. during the package sealing operation. Where the temperature exceeds 650° C. during the package sealing operation, liquid aluminum or other liquid phases formed tend to short the P-N junction of the device lying just below the metal contact.

The requirement is, then, to find a contact material which will provide a good ohmic contact to silicon, but will not be reduced to a liquid phase during the package-sealing operation.

It is, therefore, one object of the present invention to provide a good ohmic contact to a silicon device.

Another object of the invention is to provide a contact metal for such a device that will not form a liquid phase during package-sealing operation.

Yet another object of the invention is to provide a contact material that exhibits good adherence to both silicon and the oxide or glass which covers the P-N junction since, in many cases, the metallization must expand out over this protective oxide or glass layer.

Figure 1:
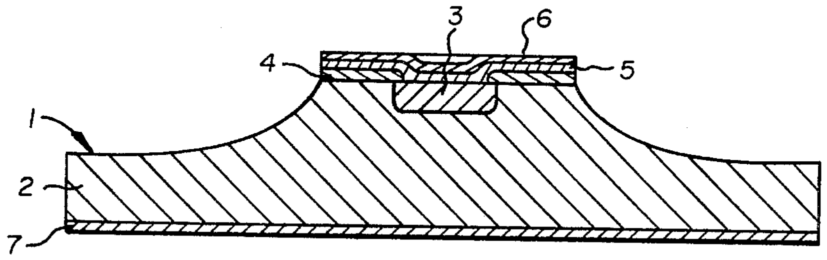
Figure 2:
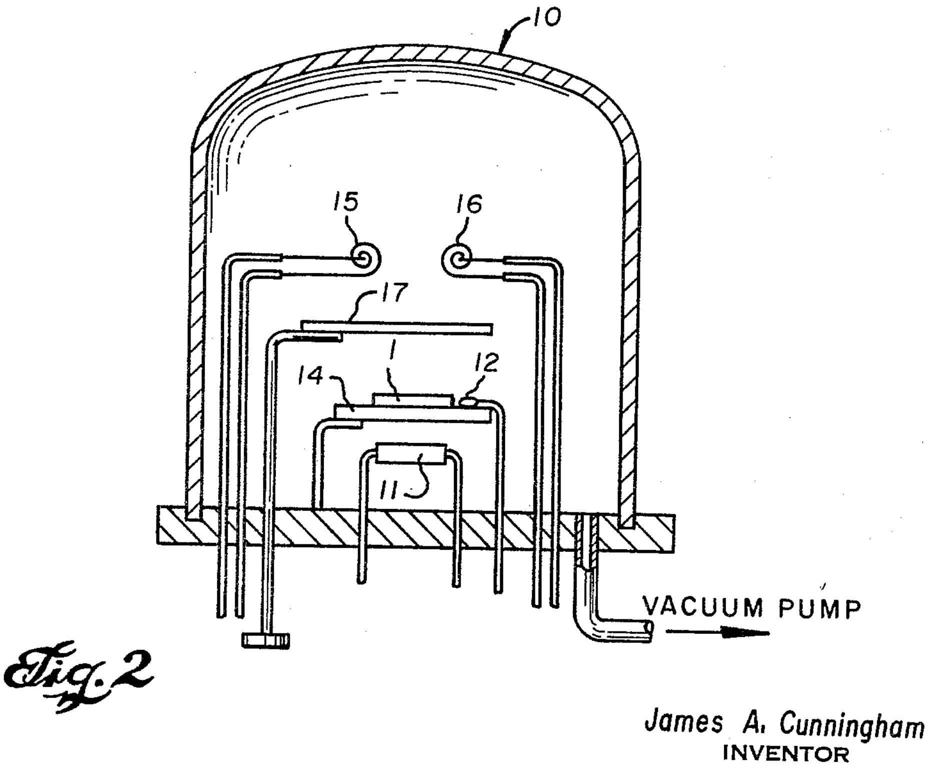

Other objects and features of the invention will become apparent from the following description when taken in conjunction with the appended claims and attached drawing in which:

FIGURE 1 is a cross-sectional view of a semiconductor device showing the laminated contact structure of the invention attached thereto; and FIGURE 2 shows an evaporation chamber which may be used in practicing the method of the invention.

In accordance with the invention, a layer of an appropriately highly conductive, high melting point material is interposed between the semiconductor wafer and a metallic oxidation resistant layer.

The efficacy of the invention depends upon the avoidance of alloying in the laminating contact structure. Alloying results if a significant amount of the metallic superstratum penetrates the interposed layer and reaches the surface of the semiconductor wafer. It is therefore important that a substantially impenetrable layer of highly conductive, high melting point material be interposed between the contact material and the surface of the semiconductor wafer. In a typical embodiment of the invention, the substratum layer is, for example, the refractory metal vanadium, and the metallic superstratum is silver. While silver is used in the preferred example, any of the noble metals such as gold, platinum, silver or alloys thereof may be used.

Referring to FIGURE 1, there is shown a semiconductor device 1 embodying the contact of the invention. The semiconductor device is in the form of a mesa diode structure. Diffused into the mesa is a region 3 of an opposite conductivity type from that of the main body 2 of the device. A protective coating 4 of some suitable material, such as an oxide of silicon or glass, for example, covers the mesa top surface with the exception of an opening through which contact is made to region 3. A layer 5 of vanadium is deposited over the protective layer 4 and into the opening over region 3. A layer 6 of silver is then deposited over the layer 5 of vanadium. A metallic coating 7 is attached to the bottom portion of the structure to form a contact thereto.

Before applying the contact material, it is important that the areas to which the contact is to be made be very clean and relatively oxide free.

To clean the area, by way of example, the device having the protective coating 4 thereon and the opening therein is first immersed in a 10% solution of ammonia biflouride, commonly known as Bell No. 2 etch. The device is left in this solution for about one minute. Upon removal it is rinsed for about two minutes in cold deionized water. The device is then inspected to see if all the oxide has been removed from the contact areas. If any oxide remains, the device is reimmersed in the etch solution and again rinsed. Next, the device is rinsed in cold running deionized water for about 20 minutes and then blotted dry. At this point the device is ready for application of the contact material, for which purpose it is moved into an evaporater 10 shown in FIGURE 2.

Referring to FIGURE 2, the evaporator 10 is equipped with a substrate heater 11 which may consist, for example, of infrared heaters 11. A thermocouple 12 is secured to the upper surface of platform 14 on which the wafer 1 is mounted to accurately ascertain the substrate temperature. The evaporator has two tungsten evaporation coils 15 and 16 mounted about three and one-half inches from the substrate.

About 0.175 gram of vanadium metal is cleaned by boiling it several times in xylene and then placed inside one of the two tungsten coils. Next, about ⅝ inch of 75 mil silver wire is placed inside a small clean tantalum boat and positioned inside of the other tungsten coil. After a vacuum of about $1 \times 10^{-5}$ mm. of mercury is obtained, the substrate is heated to about 300° C. Heat is then applied by any suitable means to the tungsten filament containing the vanadium to evaporate the vanadium. A small movable shutter 17 is used to block the first small fraction of vanadium that is evaporated. Thereafter, the shutter 17 is moved to expose the substrate 1 and a layer of 5 to 10 microinches of vanadium is deposited upon the contact area and on top of the protective coating 4 of the substrate 1 as shown in FIGURE 1 of the drawing. After the evaporation of the vanadium is complete, the substrate is cooled down to about 250° C. and the evaporation of the silver is then commenced by heating the tungsten coil containing the silver. As with the vanadium, the shutter 17 is used to block the first small fraction of silver evaporated and then removed to allow a layer of about 10 microinches of silver to be formed upon top of the vanadium layer. This layer is layer 6 shown in FIGURE 1. The substrate is cooled and the vacuum broken as the substrate temperature drops below 200° C.

The next phase of the method is the removal of the silver and vanadium from unwanted areas of the device. To do this, a thick coating of etch resistant material is applied to the areas upon which the contact material is to remain. A photoresist polymer, for example, Eastman Kodak KMER, may be applied to the contact area. After the application of the etch resistant material, the device is rinsed in a solution composed of 40% by volume of nitric acid at room temperature. After the unwanted metal is dissolved, the residue is rinsed away by placing the device in flowing deionized water. Etching the device takes from about 10 to 15 seconds. It should then be rinsed for about 5 minutes in the deionized water and then rinsed again in alcohol. The KMER coating protecting the contact area is removed by placing the device on a hot plate at about 600° F. for about two seconds, then rinsing in trichloroethylene for a few seconds and then placing it into a boiling solution of trichloroethylene for about two minutes. The softened KMER is blown off with a spray of trichloroethylene. The process may be repeated to insure complete removal of the KMER. The device is then boiled in xylene for about 30 minutes and dried. The device is now ready for encapsulation.

Although the present invention has been shown and illustrated in terms of a specific preferred embodiment thereof, it will be apparent that changes and modifications are possible without departing from the spirit and scope of the invention as defined by the appended claims.

What is claimed is:

1. A contact arrangement for a semiconductor device of the type including a substrate of silicon semiconductor material having a diffused region of one conductivity type at one major face of said substrate with a junction intermediate said diffused region and the remainder of the material of said substrate, said junction extending to said one major face beneath a layer of an oxide of said silicon semiconductor material upon said one major face, said contact arrangement comprising a first metallic film comprised of vanadium ohmically engaging the surface of said diffused region through an aperture in said oxide layer and extending out over said oxide layer to a position spaced from said junction, and another metallic layer comprised of a noble metal overlying said film comprised of vanadium, said first metallic film preventing any substantial alloying of the noble metal with the silicon semiconductor material.

2. The assembly as described in claim 1 wherein said noble metal is silver.

3. The assembly as described in claim 1 wherein said noble metal is gold.

4. The assembly as described in claim 1 wherein said noble metal is gold.

5. A semiconductor device, comprising:

(a) a body of silicon semiconductor material, (b) a layer of silicon oxide upon a major face of said body, (c) a diffused region of one conductivity type at said one major face with a P-N junction intermediate said diffused region and the remainder of said body, said P-N junction extending to said one major face beneath said oxide layer and (d) an ohmic contact electrically connected to said diffused region through an aperture in said oxide layer said ohmic contact extending out over said oxide layer to a location spaced from said P-N junction and said ohmic contact comprising a thin film comprised of vanadium and an overlying film comprised of a noble metal deposited upon said vanadium film.

6. The device as described in claim 5 wherein said noble metal is silver.

7. The device as described in claim 5 wherein said noble metal is gold.

References Cited

UNITED STATES PATENTS

| | | | |
|---|---|---|---|
| 3,116,174 | 12/1963 | Grust | 317—235 |
| 3,169,304 | 2/1965 | Gould | 317—234 |
| 3,200,468 | 8/1965 | Dahlberg | 317—234 |
| 3,231,421 | 1/1966 | Schmidt | 317—234 |
| 3,241,931 | 3/1966 | Triggs | 317—234 |

HYLAND BIZOT, *Primary Examiner.*